(12) United States Patent
Faue et al.

(10) Patent No.: US 6,415,374 B1
(45) Date of Patent: Jul. 2, 2002

(54) SYSTEM AND METHOD FOR SUPPORTING SEQUENTIAL BURST COUNTS IN DOUBLE DATA RATE (DDR) SYNCHRONOUS DYNAMIC RANDOM ACCESS MEMORIES (SDRAM)

(75) Inventors: Jon Allan Faue; John Heightley, both of Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/527,048

(22) Filed: Mar. 16, 2000

(51) Int. Cl.$^7$ .............................................. G06F 13/28
(52) U.S. Cl. ........................ 711/173; 711/170; 711/154
(58) Field of Search ................................. 711/105, 154, 711/170, 173

(56) References Cited

U.S. PATENT DOCUMENTS

| | | | | |
|---|---|---|---|---|
| 5,509,138 A | * | 4/1996 | Cash et al. .................. | 711/170 |
| 6,173,382 B1 | * | 1/2001 | Dell et al. ................... | 711/170 |
| 6,279,073 B1 | * | 8/2001 | McDracken et al. ......... | 711/105 |
| 6,330,636 B1 | * | 12/2001 | Bondurant et al. .......... | 711/105 |
| 2001/0042162 A1 | * | 11/2001 | Mes ............................ | 711/105 |
| 2001/0042163 A1 | * | 11/2001 | Ryan .......................... | 711/105 |

\* cited by examiner

*Primary Examiner*—Reba I. Elmore
(74) *Attorney, Agent, or Firm*—William J. Kudida; Hogan & Hartson LLP (57) ABSTRACT

A system and method for supporting sequential burst counts of particular utility with respect to double data rate ("DDR") synchronous dynamic random access memory ("SDRAM") devices wherein each memory bank is divided into halves, corresponding to Even ($AO_c=0$) and Odd ($AO_c=1$) portions. Separate address busses may be provided for those bits necessary to accommodate the maximum burst length. As the column addresses are loaded, the buffers associated with the Even bus check to determine if the pad address "Y" or "Y+1" should be loaded. Loading "Y+1" is necessary to support sequential counting if the start address is Odd ($AO_c=1$). "Y" selects in the Odd and Even banks are then selected and incremented, concurrently. Nevertheless, the Even field is always "Y+1", that is, $Y_{Even}=Y_{Odd}+1$. In operation, the present invention advantageously loads the "Even" section of the bank with "Y+1" initially (if required), then the first access, and all subsequent ones, continue with no knowledge that the "Y" address in the "Even" field is different from that in the "Odd" field. By means of the load circuit disclosed herein, Odd and Even column paths are also effectively electrically the same resulting in no appreciable difference in critical timing or substantial path layout differences.

17 Claims, 6 Drawing Sheets

BL=8 Even Start

|        | A4 | A3 | A2 | A1 | A0 |     |
|--------|----|----|----|----|----|-----|
| Y1Even | 1  | 1  | 1  | 1  | 0  | 6   |
| Y1Odd  | 1  | 1  | 1  | 1  | 1  | 7   |
| Y2Even | 1  | 1  | 0  | 0  | 0  | 0   |
| Y2Odd  | 1  | 1  | 0  | 0  | 1  | 1   |
| Y3Even | 1  | 1  | 0  | 1  | 0  | 2   |
| Y3Odd  | 1  | 1  | 0  | 1  | 1  | 3   |
| Y4Even | 1  | 1  | 1  | 0  | 0  | 4   |
| Y4Odd  | 1  | 1  | 1  | 0  | 1  | 5   |

A2, A1, A0 Sequentially Counting

*Fig. 2B*

BL=4 Even Start

|        | A4 | A3 | A2 | A1 | A0 |     |
|--------|----|----|----|----|----|-----|
| Y1Even | 0  | 0  | 1  | 1  | 0  | 2   |
| Y1Odd  | 0  | 0  | 1  | 1  | 1  | 3   |
| Y2Even | 0  | 0  | 0  | 0  | 0  | 0   |
| Y2Odd  | 0  | 0  | 0  | 0  | 1  | 1   |

Y1odd = Y1Even
Y2odd = Y2Even
(A4 to A1)

A1, A0 Sequentially Counting

*Fig. 2C*

BL=2 Odd Start

|        | A4 | A3 | A2 | A1 | A0 |
|--------|----|----|----|----|----|
| Y1Odd  | 1  | 1  | 1  | 1  | 1  |
| Y1Even | 1  | 1  | 1  | 1  | 0  |

SYSTEM AND METHOD FOR SUPPORTING SEQUENTIAL BURST COUNTS IN DOUBLE DATA RATE (DDR) SYNCHRONOUS DYNAMIC RANDOM ACCESS MEMORIES (SDRAM)

BACKGROUND OF THE INVENTION

The present invention relates, in general, to the field of integrated circuit double data rate ("DDR") synchronous dynamic random access memory ("SDRAM") devices. More particularly, the present invention relates to a system and method for supporting sequential burst counts in DDR SDRAM memory devices.

SDRAM memory devices function somewhat differently than conventional random access memory devices such as DRAM and take advantage of the fact that most computer system memory access are, in fact, sequential. Consequently, SDRAM devices are designed to fetch the initial and following bits in a burst as quickly as possible. An on-chip burst counter allows the column portion of the address to be incremented rapidly in order to significantly speed retrieval of information in sequential read operations. The associated memory controller furnishes the first column address location and size of the block of memory to be accessed and the SDRAM memory device itself provides the read out bits as fast as the central processing unit ("CPU") can take them, utilizing a clock to synchronize the timing between the CPU and memory device.

Historically, in order to synchronize data transfers among system logic devices, data transfers to/from conventional DRAM devices would be initiated on either the rising (the transition from logic level "zero" to "one") or falling (the transition from logic level "one" to "zero") edge of a clock signal. DDR SDRAM memory devices differ from conventional SDRAM by enabling output operations to occur on both the rising and falling edges of the clock, thereby effectively doubling the device's output frequency without increasing the actual clock frequency.

DDR SDRAM device functionality is specified by a Joint Electron Devices Engineering Counsel ("JEDEC") standard and such memories are able to achieve this effective doubling of the device's bandwidth by reading of data on both the rising and falling edges of each clock cycle. In DDR SDRAM devices, the first column address of a burst is supplied on the rising edge of the clock. However, the address for the data to be output on the falling edge of the clock may be obtained at this point in time in high-speed devices in order to be able to meet the data frequency requirements. In this case, the least significant address bit (A0) does not go to the column decoder since two sequential bits are always accessed. Only higher order bits are used to select a column, however, the least significant bit does determine the next sequential state for the higher order bits in a sequential accessing mode. One or more of the higher order address bits will be different for the rising and falling edge data any time A0=1 for rising edge data giving rise to the need for efficiently generating the address for pre-fetching the falling edge data. For example, if the first address for a burst of eight bits of data (A2 A1 A0) is 000, the next sequential address required is 001 so the actual column address (A2 A1) is the same for rising and falling edge data. However, if the first address is 001, the next sequential address is 010 and the actual column address is different for the rising and falling edge data.

In order to support sequential burst counts in DDR SDRAM memory devices, all data to be potentially accessed, regardless of actual count sequence, could be pre-fetched. Thereafter, decisions may be made as to what addresses were actually read from, or written to, based on the count sequence, type and starting address. However, pre-fetching all potentially accessed data is not an efficient technique if the data will ultimately not be used, such as when a particular burst sequence is interrupted.

SUMMARY OF THE INVENTION

In the particular embodiment disclosed herein, each memory bank is divided into halves, corresponding to Even ($A0_c=0$) and Odd ($A0_c=1$). The Odd and even sections have separate buffers, counters and address busses for all column addresses associated with the maximum burst length ever required, for example, two bits if the maximum burst length is eight bits since A0 is always 0 for the even section and 1 for the Odd section. All other column address bits are on a common bus shared by the Odd and even sections.

As the column addresses are loaded, the buffers associated with the Even bus check to determine if the pad address "Y" or "Y+1" should be loaded. Loading "Y+1" is necessary to support sequential counting if the start address is Odd ($A0_c=1$). "Y" selects in the Odd and Even banks are then selected and incremented, concurrently. Nevertheless, the Even field is always "Y+1", that is, $Y_{Even}=Y_{Odd}+1$.

Stated another way, the system and method of the present invention advantageously loads the "Even" section of the bank with "Y+1" initially (if required), then the first access, and all subsequent ones, continue with no knowledge that the "Y" address in the "Even" field is different from that in the "Odd" field. Odd and Even column paths are also, effectively electrically the same resulting in no appreciable difference in critical timing or substantial path layout differences.

Particularly disclosed herein is a memory device including a memory array comprising first and second portions thereof, the memory array being addressable by corresponding first and second column decoders. First, second and third buffers are coupled to first, second and third address output busses on which the column addresses may be placed for accessing data in first and second portions of the memory array. The first and second address output busses are respectively coupled to first and second column decoders with the third address output bus common to both the first and second memory portions. First and second load circuits are provided, each load circuit being interposed between the first and second buffer circuits respectively and a first portion of the address input bus, such portion being associated with the burst counter address bits and being common to both first and second load circuits. The second load circuit being selectively operative to add an integer amount to the first set of address bits for input to the second buffer. Third buffers are interposed between a second portion of the input address bus and the third column address output bus. First and second burst counters are provided, each counter is interposed between the output address bus and the first and second buffers respectively and each is operative to count from a starting address in sequential order coupling the sequential addresses to the input of the first and second buffers respectively.

Further disclosed herein is method for enabling sequential burst counts in a memory device comprising the steps of partitioning a memory array into first and second portions thereof; each of the first and second portions having an associated first and second column decoder respectively. First, second and third buffers are coupled to first, second and third address output busses on which the column addresses may be placed for accessing data in first and second portions of the memory array. The first and second address output busses are respectively coupled to first and second column decoders with the third address output bus common to both the first and second memory portions. First and second load circuits are provided, each load circuit being interposed between the first and second buffer circuits respectively and a first portion of the address input bus, such portion being associated with the burst counter address bits and being common to both first and second load circuits. The second load circuit being selectively operative to add an integer amount to the first set of address bits for input to the second buffer. Third buffers are interposed between a second portion of the input address bus and the third column address output bus. First and second burst counters are provided, each counter is interposed between the output address bus and the first and second buffers respectively and each is operative to count from a starting address in sequential order coupling the sequential addresses to the input of the first and second buffers respectively. A start address for a burst access to the memory array is determined and an integer amount is selectively added to an address directed to the second buffer if the start address is indicative of an address in the first portion of said memory array.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figures 1, 2A:
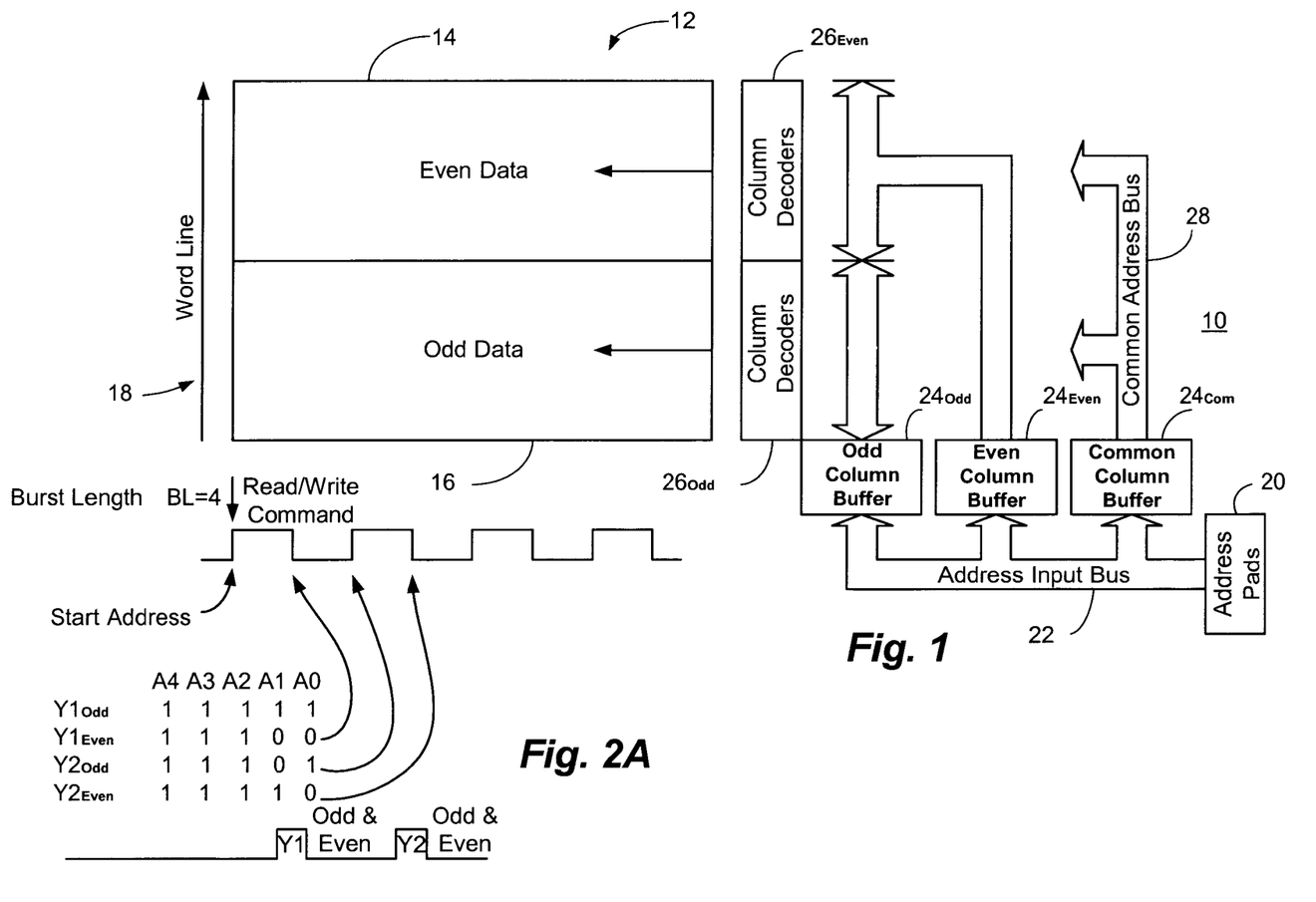
FIG. 1 is a functional block diagram of a portion of a memory bank and associated circuitry for supporting sequential burst counts in DDR SDRAM memory devices pertaining to the lower order bits of a column address and also showing the common address bus.
FIG. 2A is a representative example of the possible functionality of the system and method of the present invention in accordance with the specific embodiment disclosed herein for a burst length of four and an Odd start.

With reference now to FIG. 1, a functional block diagram of a portion of a memory bank and associated circuitry for supporting sequential burst counts in a DDR SDRAM memory device 10 in accordance with the present invention is shown. The portion of the memory device 10 illustrated pertains to the lower order bits of a column address burst as will be more fully described hereinafter and comprises at least one memory bank 12 logically divided into a portion which is accessed for Even data 14 and Odd data 16, both orthogonal to the memory device 10 word lines 18.

Access to the memory device 10 is effectuated by means of a number of address pads 20 which are coupled to an internal address input bus 22. The address input bus 22 is coupled through an Odd column buffer $24_{Odd}$ and an Even column buffer $24_{Even}$ to corresponding column decoders $26_{Odd}$ and $26_{Even}$ respectively.

As shown, each portion of the memory bank 12 is assigned to the Even or Odd address data 14, 16. Depending upon the start address, the Even or Odd data 14, 16 will be mapped to the rising or falling data (wherein data is captured on the rising or falling edge of the memory device clock signal).

In accordance with the principles of the present invention, the Y-selects for each half of the memory bank 12 are separate and selected from partially different address busses. For a given maximum burst length, only the addresses necessary to generate the maximum burst need be different, the other share a common address bus 28. As will be more fully described hereinafter, in order to maintain proper functionality of the back end data path, both Y-selects must occur at the same time. However, for a sequential burst with an Odd start address, the Even path may actually not load the pad address "Y", but "Y+1".

With reference additionally now to FIG. 2A, a representative example of the possible functionality of the system and method of the present invention in accordance with the specific embodiment disclosed herein is shown. As indicated, the solution to the aforedescribed problem is to examine the start address before it is loaded into either path and decide if the Even path can load the pad or pad+1. Since the Even section of "C" bits has its own buffers and counters for the bits associated with the burst counters, as long as it is loaded with "Y+1", it will continue to increment as +1 compared to the Odd section. The Odd section always loads the pad address. In an interleaved mode of operation, Odd and Even always load the pad, while in minimum burst length situations, (e.g. BL=2 for DDR), the Even section always loads the pad. As indicated, $Y1_{Odd}$ and $Y1_{Even}$ (and $Y2_{Odd}$ and $Y2_{Even}$) must occur at the same time.

Figure 2B:
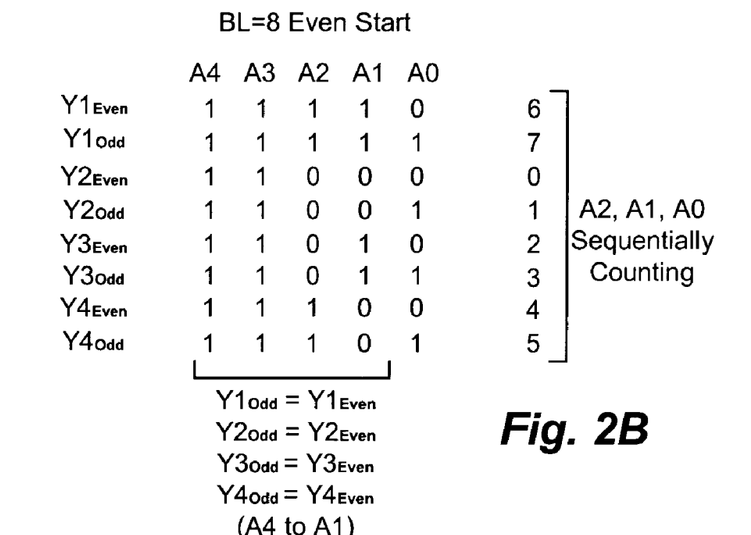
FIGS. 2B through 2D inclusive illustrate additional representative examples as a follow-on to that shown in FIG. 2A for a burst length of eight with an even start, a burst length of four with an even start and a burst length of two with an Odd start respectively.
Figure 2C:
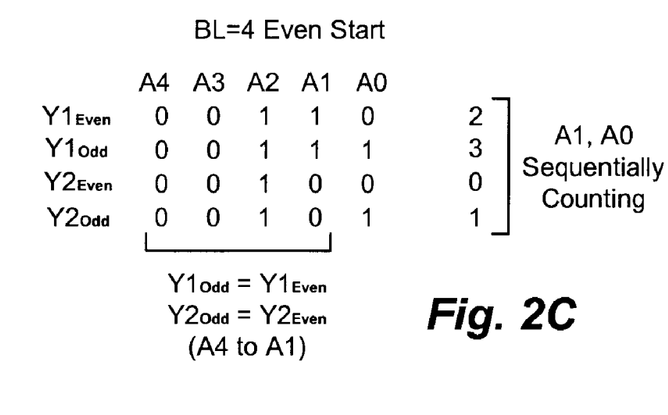
Figure 2D:
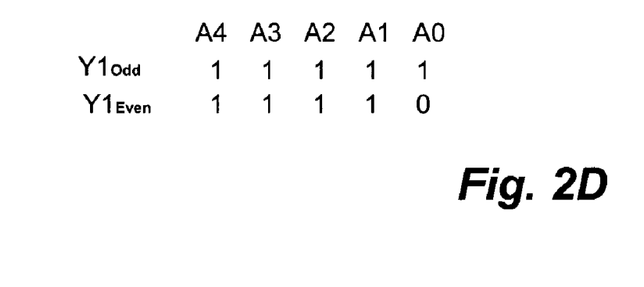

With reference additionally now to FIGS. 2B through 2D inclusive, additional representative examples as a follow-on to that shown in FIG. 2A are shown. In FIG. 2B, a burst length of eight with an even start is illustrated and it can be seen that $Y1_{Odd}=Y1_{Even}$, $Y2_{Odd}=Y2_{Even}$, $Y3_{Odd}=Y3_{Even}$ and $Y4_{Odd}=Y4_{Even}$ for A4 through A1. A3 and A4 are illustrated as an example only as they do not actually count and are part of the common address bus 28. In FIG. 2C, a burst length of four with an even start is illustrated and it can be seen that $Y1_{Odd}=Y1_{Even}$ and $Y2_{Odd}=Y2_{Even}$ for A4 through A1. In FIG. 2D, a burst length of two with an Odd start is shown. In this instance, since only AO is different, in the burst length two (BL=2) case, no special A1, A2 loading is required.

Figure 3:
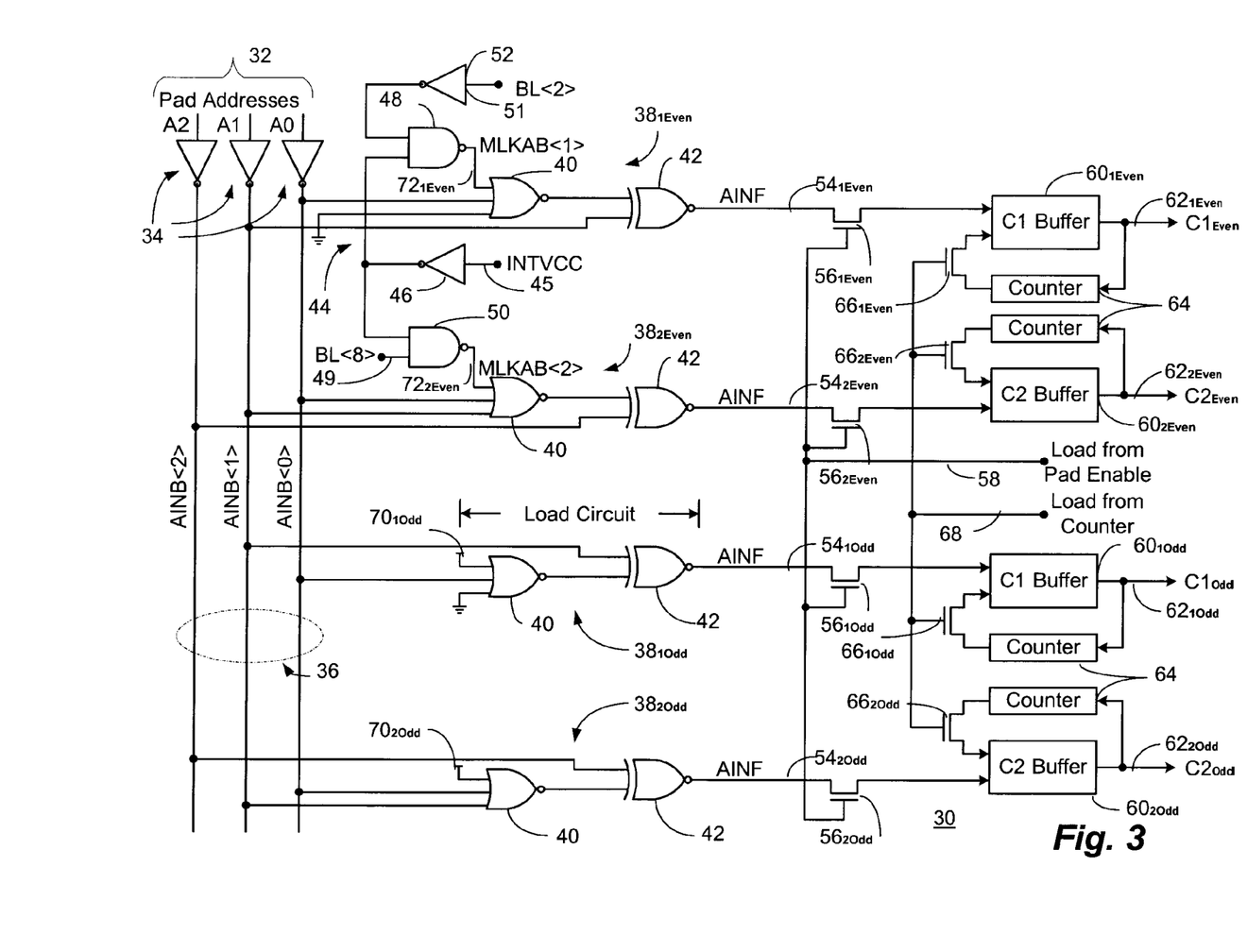
FIG. 3 is a simplified conceptual schematic and functional block diagram of a possible implementation of the system and method of the present invention in a DDR SDRAM memory device wherein the maximum burst length ("BL") is eight, therefore indicating that address pads A2 and A1 require different Odd and Even output busses for the column path.

With reference additionally now to FIG. 3, a simplified conceptual schematic and functional block diagram of a circuit 30 comprising a possible implementation of the system and method of the present invention in a DDR SDRAM memory device 10 is shown. In the particular representative circuit 30 illustrated, the maximum number burst length is eight, therefore indicating that only address pads A2 and A1 require different Odd and Even busses for the column path. The look ahead function is only required for the addresses to be placed on the even bus since the pad addresses are always passed without modification to the Odd bus. In a sequential count, the next state of address A1 will be the same as the current state if A0=0 and will be the complement of the current state if A0=1. Denoting the appropriately modified or unmodified version of A1 as $C1_{even}$ and using a following letter "B" (i.e. the complement or "bar") to denote the complement function, the logical expression for $C1_{even}$ is:

$C1_{even}$=(A1 AND A0B) OR (A1B AND A0)

This is an Exclusive OR (XOR) function and can be written:

$C1_{even}$=A1B XOR A0B

Through a well known logical transformation, an equivalent representation is:

$C1_{even}$=A1B XNOR A0

In the case of A2, the next state in a sequential count will be the same as the current state if either A0=0 or A1=0 and will be the complement of the current state if both A0=1 and A1=1. Denoting the modified version of A2 as $C2_{even}$, the logical expression for $C2_{even}$ is:

$C2_{even}$=(A2 AND(A1B OR A0B)) OR (A2B AND (A1 AND A0)) Through a well known logical transformation, an equivalent representation is:

$C2_{even}$=(A2 AND(A1B OR A0B)) OR (A2B AND (A1B OR A0B)B)

This is an Exclusive OR function and can be rewritten:

$C2_{even}$=A2B XOR (A1B OR A0B) Through a well known logical transformation, an equivalent representation is:

$C2_{even}$=A2B XNOR (A1B OR A0B)B

The circuit 30 is coupled to a number of pad addresses 32 (e.g., A2, A1 and A0) from the address pads 20 (FIG. 1) which are then inverted by means of respective inverters 34 to provide a like number of address input bar ("AINB") signal lines 36 (e.g. AINB<2>, AINB<1 >and AINB<0>) forming a portion of the address input bus 22 (FIG. 1). The signal lines 36 provide inputs to two pairs of Even and Odd load circuits 38 specifically comprising load circuits $38_{1Even}$, $38_{2Even}$, $38_{1Odd}$ and $38_{2Odd}$. Each of the Even and Odd load circuits 38 comprises, in pertinent part, a three input NOR gate 40 and a two input exclusive NOR ("XNOR") gate 42 as will be more fully described hereinafter.

As indicated, each of the Even load circuits $38_{1Even}$, $38_{2Even}$, is coupled to a "might look ahead bar" ("MLKAB") enable circuit 44 which receives an interleave supply voltage ("INTVCC") signal on line 45 to inverter 46. The output of inverter 46 is supplied as one input to a pair of two input NAND gates 48, 50 which have their remaining input coupled to receive a burst length two ("BL<2>") signal on line 51 through inverter 52 and an uninverted BL<8> signal on line 49 respectively. The output of NAND gate 48 is denominated MLKAB<L> and the output of NAND gate 50 is denominated MLKAB<2>.

An output signal "AINF" is furnished at the output of the XNOR gates 42 of each of the four load circuits $38_{1Even}$, $38_{2Even}$, $38_{1Odd}$ and $38_{2Odd}$ on lines $54_{1Even}$, $54_{2Even}$, $54_{1Odd}$ and $54_{2Odd}$ respectively. Application of the AINF signals is controlled by a like number of transistors $56_{1Even}$, $56_{2Even}$, $56_{1Odd}$ and $56_{2Odd}$ which are commonly controlled by a signal coupled to their respective gate terminals on input line 58 to allow the corresponding Even and Odd column buffers $60_{1Even}$, $60_{2Even}$, $60_{1Odd}$ and $60_{2Odd}$ (designated $24_{Even}$ and $24_{Odd}$ in FIG. 1) to be loaded from the pad enable. Output of the various column buffers is provided on output lines $62_{1Even}$, $62_{2Even}$, $62_{1Odd}$ and $62_{2Odd}$ to provide corresponding signals $C1_{Even}$, $C2_{Even}$, $C1_{Odd}$ and $C2_{Odd}$. These signals are also supplied as input to a like number of counters 64 associated with each of the column buffers $60_{1Even}$, $60_{2Even}$, $60_{1Odd}$ and $60_{2Odd}$, the outputs of which are selectively applied through a number of transistors $66_{1Even}$, $66_{2Even}$, $66_{1Odd}$ and $66_{2Odd}$ as inputs to the respective column buffers $60_{1Even}$, $60_{2Even}$, $60_{1Odd}$ and $60_{2Odd}$. The transistors $66_{1Even}$, $66_{2Even}$, $66_{1Odd}$ and $66_{2Odd}$ have their gate terminals coupled to input line 68 which enables the respective column buffers $60_{1Even}$, $60_{2Even}$, $60_{1Odd}$ and $60_{2Odd}$ to be loaded from the corresponding one of the counters 64.

As can be seen, the circuit 30 appears electrically the same in terms of loading and gate delays due to the presence of the respective load circuits 38 in both the Even and Odd paths. It can also be seen that the circuits $38_{1Even}$ and $38_{2Even}$ implement the logical expressions for $C1_{even}$ and $C2_{even}$ respectively when signals MLKAB<1> and MLKAB<2> are at a logic level "low" respectively. These conditions occur when INTVCC is "low" (in sequential mode) and BL<2> is "low" or BL<8> is "high" respectively. These are the conditions under which $C1_{even}$ and $C2_{even}$ require the look ahead function respectively. When MLKAB<1> is "high", the XOR circuit simply inverts AINB<0> and $C_{1even}$ receives the state of A1. Likewise, when MLKAB<2> is "high", $C_{2even}$ receives the state of A1.

For the Odd column bus, all look ahead functions are disabled by merely providing a VCC level to inputs $70_{1Odd}$ and $70_{2Odd}$ of NOR gates 40 in load circuits $38_{1Odd}$ and $38_{2Odd}$, in which case, they always load the pad address.

Figure 4:
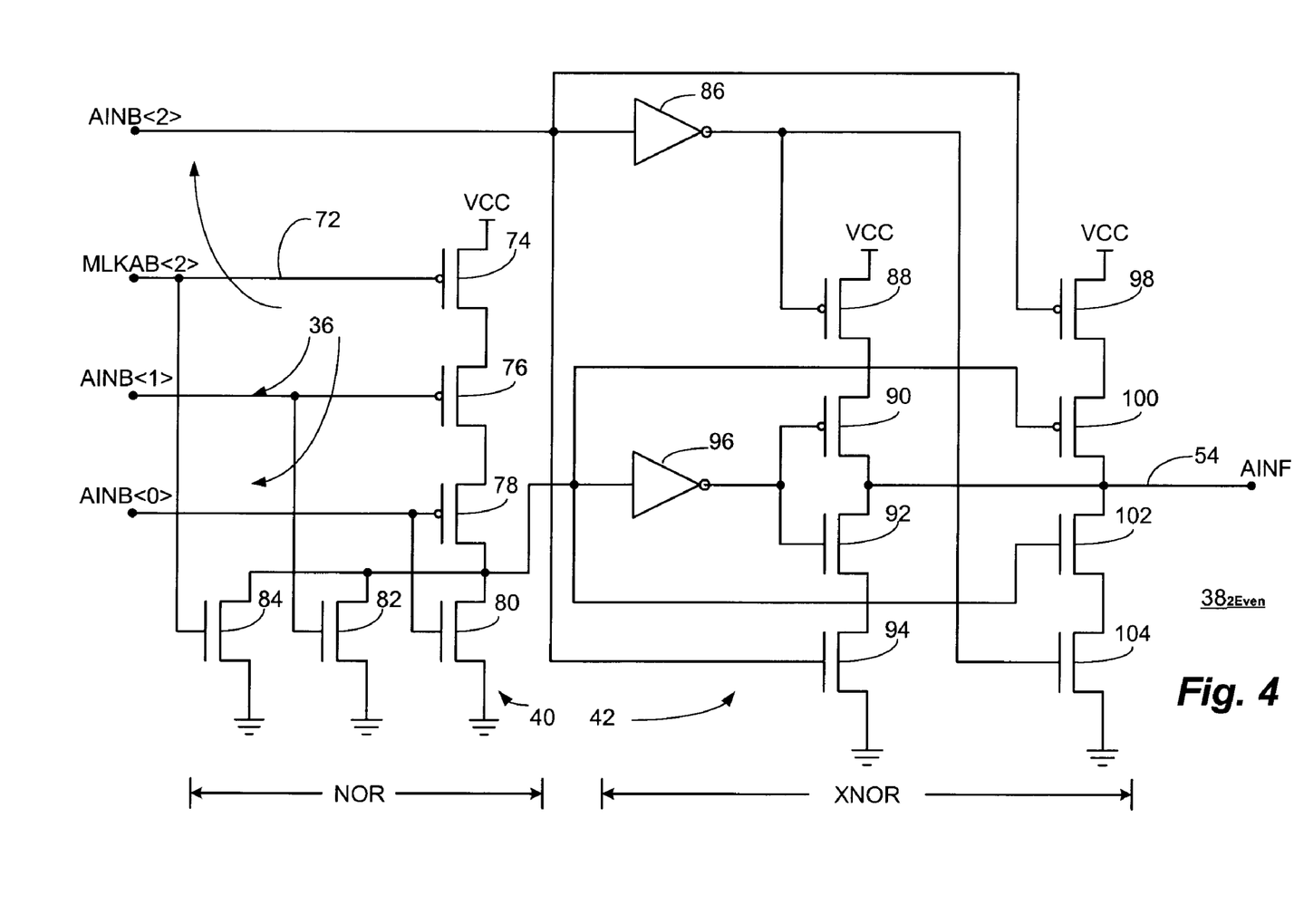
FIG. 4 is a schematic illustration of an actual representative column count logic load circuit comprising the NOR and XNOR logic blocks shown in FIG. 3 for use in implementing the system and method of the present invention with respect to an exemplary DDR SDRAM memory device.

With reference additionally now to FIG. 4, a more detailed schematic illustration of an exemplary load circuit $38_{2Even}$ of an actual representative column count logic load circuit 30 is shown comprising the NOR gate 40 and XNOR gate 42 logic blocks depicted in the preceding figure. With respect to this figure, inputs and outputs previously described are like numbered and the foregoing description thereof shall suffice herefor.

The NOR gates 40, conventionally comprises a series connected string of P-channel transistors 74, 76 and 78 in series with parallel coupled N-channel transistors 80, 82 and 84, all coupled between VCC and circuit ground. The signal MLKAB (in the case of load circuits $38_{1Even}$ and $38_{2Even}$) is coupled to the gate terminal of P-channel transistor 74 while signals AINB<1> and AINB<0> are coupled to the gate terminals of P-channel transistors 76 and 78 respectively. These same signals are also individually coupled to the gate terminals of N-channel transistors 84, 82 and 80 respectively.

The signal AINB<2> is supplied directly to, and through inverter 86 of, XNOR gate 42. The XNOR gate 42 comprises a first series connected transistor string made up of P-channel transistors 88 and 90 in series with series connected N-channel transistors 92, 94 coupled between VCC and circuit ground. Output from the preceding NOR gate 40 is taken at the node intermediate P-channel transistor 78 and N-channel transistor 80 and supplied through inverter 96 to the common connected gates of P-channel transistor 90 and N-channel transistor 92. The gate terminal of P-channel transistor 88 is coupled to the output of inverter 86 while the gate terminal of N-channel transistor 94 is coupled directly to receive the signal AINB<2>.

The XNOR gate 42 further comprises another series connected transistor string comprising P-channel transistors 98 and 100 in series with N-channel transistors 102 and 104 coupled between VCC and circuit ground. The gate of P-channel transistors 98 and 100 are respectively coupled to signal AINB<2> and the output of NOR gate 40 while the gate of N-channel transistors 102 and 104 are coupled to the output of NOR gate 40 and the output of inverter 86 respectively. The output of XNOR gate 42 is taken at line 54 coupled to the node intermediate P-channel transistor 90 and N-channel transistor 92 in addition to P-channel transistor 100 and N-channel transistor 102. In operation, each of the load circuits 38 is functional to determine whether to load the pad or pad +1 as previously described.

Figure 5:
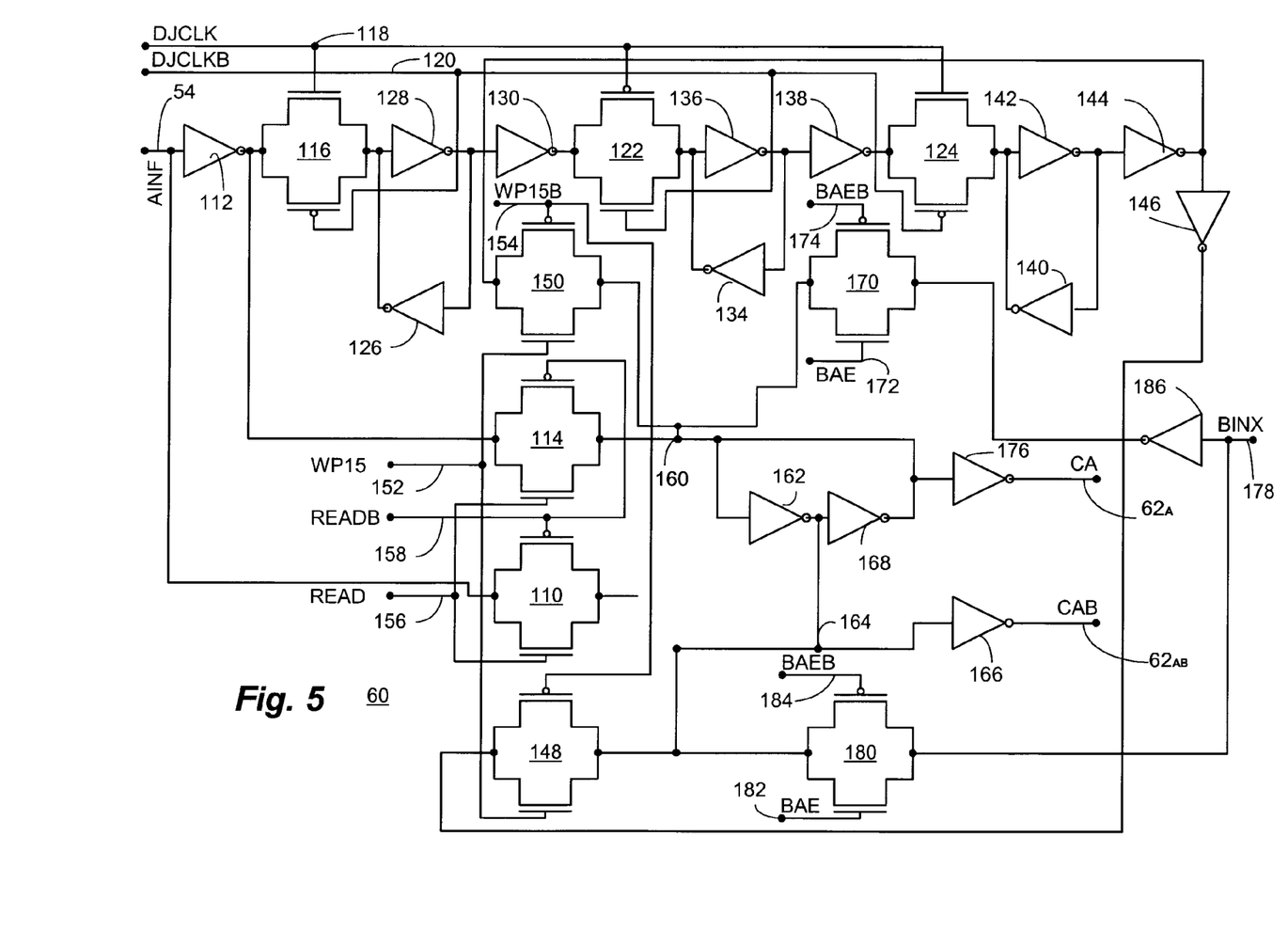
FIG. 5 is an accompanying schematic illustration of an address pad A2 and A1 column address buffer circuit as shown generally in FIG. 3 and for use in conjunction with the particular column count logic load circuit of FIG. 4.

With reference additionally now to FIG. 5, a representative schematic illustration of a particular one of an address pad A2 and A1 column address buffer circuit 60 (as shown generally in FIG. 3 and for use in conjunction with the particular column count logic load circuit of FIG. 4) is illustrated. The circuit 60, corresponding to each of the column buffers $60_{1Even}$, $60_{2Even}$, $60_{1Odd}$ and $60_{2Odd}$ of FIG. 3, is coupled to receive the AINF signal on line 54.

Line 54 is coupled to one set of the common connected terminals of parallel coupled transistor pair 110 as shown in addition to the input of inverter 112, which has its output coupled to one set of the common connected terminals of parallel coupled transistor pairs 114 and 116. The circuit 60 also receives as input a derivative of the memory device JCLK clock signal ("DJCLK") on line 118 as well as its complement DJCLKB ("DJCLK bar") on line 120. Line 118 is coupled to the gate terminals of one transistor of the sets of parallel coupled transistor pairs 116, 122 and 124 while line 120 is coupled to the gate terminal of the other transistors thereof. The output of transistor pair 116 is coupled to the input of a latch comprising inverters 126 and 128 and, in turn, through inverter 130 to the input of transistor pair 122. In like manner, the output of transistor pair 122 is coupled to the input of a latch comprising inverters 134 and 136 and, in turn, through inverter 138 to the input of transistor pair 124. Similarly, the output of transistor pair 124 is coupled to the input of a latch comprising inverters 140 and 142 and, in turn, through inverter 144 to the input inverter 146 and the input of transistor pair 150. The output of inverter 146 is supplied to one set of the common connected terminals of parallel coupled transistor pair 148 as well.

The write from pad ("WP") signal WP15 is supplied to the circuit 60 on line 152 for input to a gate terminal of one of the transistors in transistor pairs 148 and 150, with the gate terminal of the other transistor in each pair being coupled to receive the complement signal WP15B on line 154. A READ signal on line 156 is coupled to a gate terminal of one of the transistors in transistor pairs 110 and 114 while its complement, READB, is furnished on line 158 to the gate terminal of the other transistor in each pair.

Common connected terminals of transistor pairs 114 and 150 are coupled to one set of common connected terminals of parallel coupled transistor pair 170 as well as to the inputs of inverters 162 and 176. Similarly, common connected terminals of transistor pairs 110 and 148 are coupled to one set of common connected terminals of parallel coupled transistor pair 180 as well as to the inputs of inverters 166 and 168. The output of inverter 162 is also coupled to the input of inverter 168 which, in turn, is also coupled to the input of inverter 176.

The gate terminal of one transistor of transistor pairs 170 and 180 is coupled to receive a burst address enable ("BAE") signal on lines 172 and 182 respectively while the gate terminal of the other transistor is coupled to receive its complement, BAEB, on lines 174 and 184 respectively. A burst input signal ("BINX") furnished on line 178 is supplied to common connected terminals of transistor pair 180 directly and through inverter 186 to common connected terminals of transistor pair 170. Outputs from the circuit 60 are taken at the output nodes of inverters 176, 166 to provide complementary column address ("CA" and "CAB") signals respectively on lines $62_A$ and $62_{AB}$.

In operation, the signal WP15 on line 152 indicates a load from the pad 1.5 cycles previous for write cycles while the READ signal on line 156 indicates a load from the pad for READ signals. The signal BAE initiates a load from the associated counter 64 while the BINX signal provides the counter address.

Figure 6:
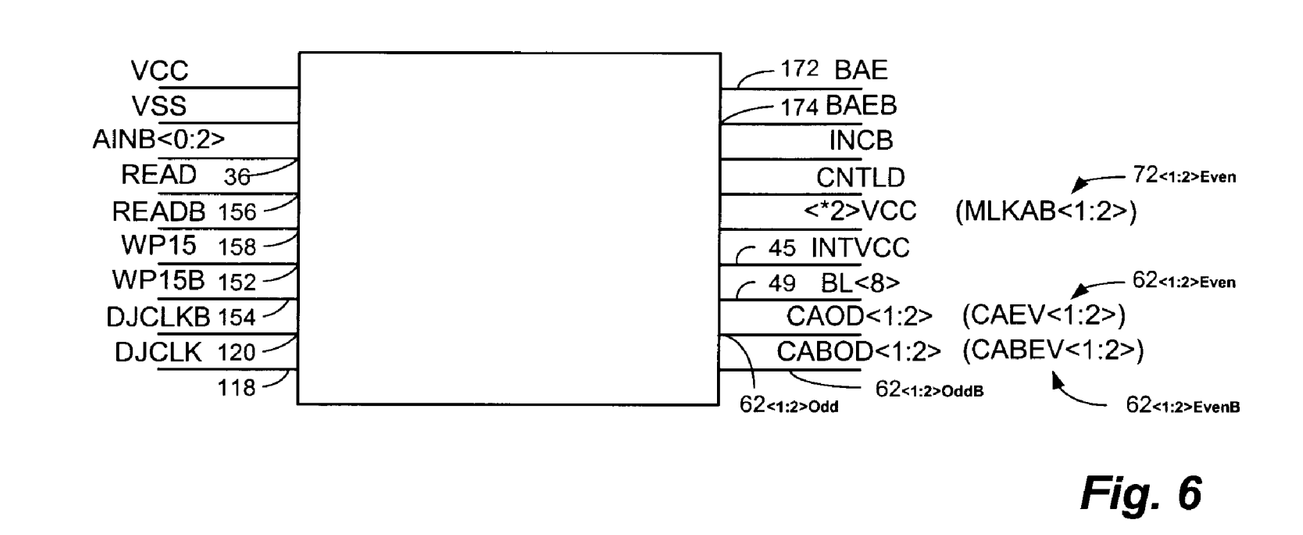
FIG. 6 is an illustration of the various inputs and outputs to the combined column count logic load and column address buffer circuits of FIGS. 4 and 5 further indicating how the Odd and Even portions thereof are the same and (differ)

With reference additionally now to FIG. 6, a simplified illustration of the various inputs and outputs to the combined column count logic load and column address buffer circuits 38 and 60 of FIGS. 4 and 5 further is provided. In this figure, like structure and signals to that previously described is like numbered and the foregoing description thereof shall suffice herefor. The similarities and differences between the inputs and outputs of the Odd and Even portions thereof are particularly shown.

Figure 7:
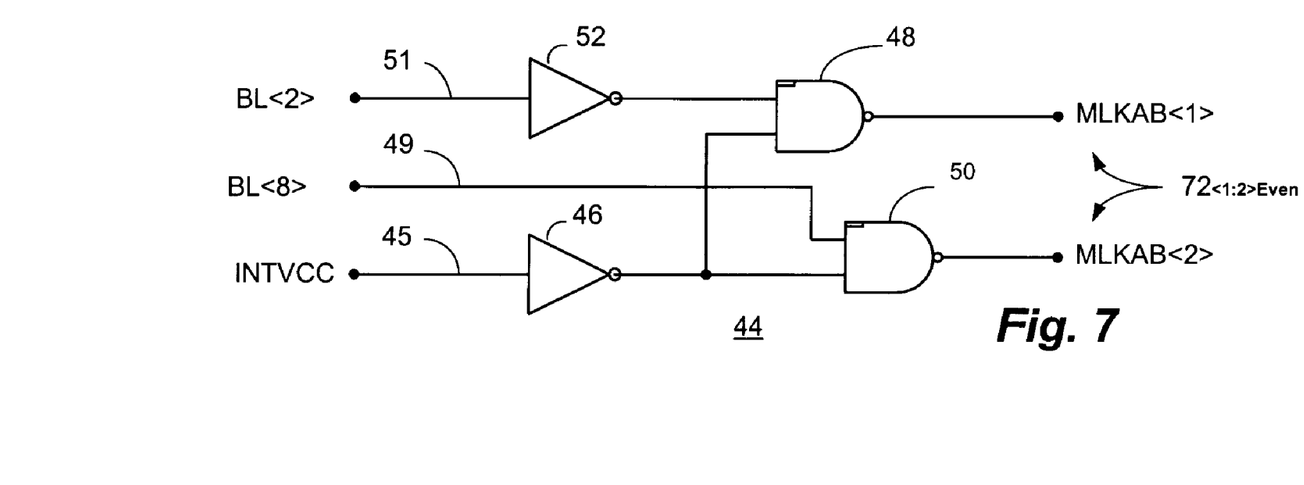
FIG. 7 is an isolated logic block diagram of the circuit for providing the might look ahead bar ("MLKAB") signals to an Even one of the column count logic load circuit of FIG. 4 as previously illustrated in FIG. 3.

With reference additionally now to FIG. 7, an isolated logic block diagram of the circuit 44 for providing the might look ahead bar ("MLKAB") signals to an Even one of the column count logic load circuit of FIG. 4 is shown. This circuit is, in essence, the only difference between the load circuits $38_{XEven}$ and $38_{XOdd}$ but it does not electrically alter the load circuits in the Even path from those in the Odd path in terms of loading and gate delays as previously described.

While there have been described above the principles of the present invention in conjunction with specific memory device architecture, circuitry, components and burst lengths, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory device comprising:
   a memory array comprising first and second portions thereof, said memory array being addressable by corresponding first and second column decoders;
   at least first and second buffers coupled to said first and second column decoders respectively, said at least first and second buffers being coupled to an output address bus on which at least column addresses to said memory device may be placed for accessing data in said memory array; and
   first and second load circuits, each of said load circuits being respectively interposed between an input address bus on which column addresses are supplied address pads to said memory device and each of said at least first and second buffers, said load circuit associated with said second buffer being selectively operative to add an integer amount to an address placed on said input address bus for input to said second buffer.

2. The memory device of claim 1 wherein said memory device further comprises:
   first and second counters, each of said first and second counters being respectively associated with each of said first and second buffers.

3. The memory device of claim 2 wherein said memory device further comprises:
   first and second switching devices, each of said switching devices being interposed between said first and second load circuits and said first and second buffers for selectively allowing said first and second buffers to be loaded from said input address bus or said associated first and second counters respectively.

4. The memory device of claim 1 wherein said first and second load circuits present substantially identical electrical loads between said input address bus and said first and second buffers.

5. The memory device of claim 1 wherein said first and second load circuits present substantially identical gate delays between said input address bus and said first and second buffers.

6. The memory device of claim 1 wherein said second load circuit has an additional input thereof for receiving a might look ahead signal.

7. The memory device of claim 1 wherein said first and second load circuits comprise series connected NOR and XNOR logic gates.

8. The memory device of claim 1 wherein said memory device comprises a synchronous memory device.

9. The memory device of claim 1 wherein said memory device comprises a dynamic random access memory device.

10. The memory device of claim 1 wherein said integer amount comprises 1.

11. A method for enabling sequential burst counts in a memory device comprising:
    partitioning a memory array into first and second portions thereof; each of said first and second portions having an associated first and second column decoder respectively;
    providing at least first and second buffers coupled to said first and second column decoders respectively and to an address bus for receiving at least column addresses for accessing data in said first and second portions of said memory array;
    determining a start address for a burst access to said memory array; and
    selectively adding an integer amount to an address directed to said second buffer if said start address is indicative of an address in said first portion of said memory array.

12. The method of claim 11 further comprising the step of:
    providing first and second counters, each of said first and second counters being respectively associated with each of said at least first and second buffers.

13. The method of claim 12 further comprising the step of:
    interposing a switching device between each of said first and second load circuits and said at least first and second buffers; and
    selectively enabling said switching devices for allowing said first and second buffers to be loaded from said address bus or said associated first and second counters respectively.

14. The method of claim 11 wherein said step of partitioning said memory array is carried out by the step of:
    dividing said memory array into Odd and even portions thereof.

15. The method of claim 11 wherein said step of selectively adding an integer amount is only carried out with respect to said even portion of said memory array.

16. The method of claim 11 wherein said step of selectively adding an integer amount to an address further comprises the step of:
    initially determining a burst length of an access to said memory array; and
    alternatively adding said integer amount to said address if said burst length is greater than a predetermined value and not adding said integer amount to said address if said burst length is equal to or less than a predetermined value.

17. A method for supporting sequential burst counts in an integrated circuit memory device including a memory array in which a first column address of a burst of data to be read out from said memory array is furnished to said device on a first transition of a clocking signal and a subsequent column address is implied from said first column address on a second opposite transition of said clocking signal, said method comprising:
    determining if a lowest order bit of at least three lower order bits of said first column address furnished on said first transition of said clocking signal is a "0" or a "1";
    initiating obtaining of said data from said memory array on said first transition of said clocking signal corresponding to said subsequent column address lower order bits being "00" if said lowest order bit is determined to be "0"; and
    alternatively initiating obtaining of said data from said memory array on said first transition of said clocking signal corresponding to said subsequent column address lower order bits being "01" if said lowest order bit is determined to be "1".

* * * * *